(12) United States Patent
Wang

(10) Patent No.: US 6,667,121 B2
(45) Date of Patent: Dec. 23, 2003

(54) HEAT TREATABLE COATED ARTICLE WITH ANTI-MIGRATION BARRIER BETWEEN DIELECTRIC AND SOLAR CONTROL LAYER PORTION, AND METHODS OF MAKING SAME

(75) Inventor: Hong Wang, Belleville, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 31 days.

(21) Appl. No.: 09/995,807

(22) Filed: Nov. 29, 2001

(65) Prior Publication Data
US 2003/0044652 A1 Mar. 6, 2003

Related U.S. Application Data

(63) Continuation-in-part of application No. 09/858,873, filed on May 17, 2001.

(51) Int. Cl.$^7$ .............................................. B32B 15/04
(52) U.S. Cl. ..................... 428/699; 428/428; 428/432; 428/448; 428/469; 428/472; 428/680; 428/666; 428/697; 428/698; 428/701; 428/702; 428/704
(58) Field of Search ................................ 428/426, 428, 428/432, 446, 448, 450, 457, 469, 472, 688, 689, 697, 698, 699, 701, 702, 704, 544, 615, 621, 627, 628, 629, 630, 632, 633, 655, 660, 663, 666, 668, 680

(56) References Cited

U.S. PATENT DOCUMENTS

| 5,085,926 A | 2/1992 | Iida et al. |
| 5,229,194 A | 7/1993 | Lingle et al. |
| 5,298,048 A | 3/1994 | Lingle et al. |
| 5,344,718 A | 9/1994 | Hartig et al. |
| 5,376,455 A | 12/1994 | Hartig et al. |
| 5,425,861 A | 6/1995 | Hartig et al. |
| 5,514,476 A | 5/1996 | Hartig et al. |
| 5,521,765 A | 5/1996 | Wolfe |
| 5,557,462 A | 9/1996 | Hartig et al. |

(List continued on next page.)

FOREIGN PATENT DOCUMENTS

| EP | 0 546 470 | 6/1993 |
| EP | 1 123 906 | 8/2001 |
| WO | 1 174 397 | 1/2002 |
| WO | WO 02/092527 | 11/2002 |

OTHER PUBLICATIONS

International Search Report dated Apr. 8, 2003.
U.S. Patent Application Ser. No. 09/858,873 filed May 17, 2001.

(List continued on next page.)

*Primary Examiner*—Deborah Jones
*Assistant Examiner*—Andrew T Piziali
(74) *Attorney, Agent, or Firm*—Nixon & Vanderhye P.C.

(57) ABSTRACT

A heat treatable coated article includes an oxidation graded layer designed so as to include an at least partially oxided anti-migration or barrier layer(s) portion provided between a solar management layer portion (e.g., NiCr layer portion) and a dielectric layer (e.g., silicon nitride). In certain example embodiments, the anti-migration or barrier layer(s) portion may include a metal oxide, and function(s) to prevent element(s) from migrating between the solar management layer and the dielectric layer upon heat treatment (HT) of the coated article. As a result, the coated article has improved color stability (and thus a lower $\Delta E^*$ value) upon HT. In certain example embodiments, a single target may be used to sputter the graded layer including the anti-migration layer portions and the more metallic central portion. Coated articles herein may be used in the context of insulating glass (IG) window units, other architectural windows, vehicle windows, or the like.

53 Claims, 7 Drawing Sheets

U.S. PATENT DOCUMENTS

| | | |
|---|---|---|
| 5,563,734 A | 10/1996 | Wolfe et al. |
| 5,688,585 A | 11/1997 | Lingle et al. |
| 5,800,933 A | 9/1998 | Hartig et al. |
| 6,014,872 A | 1/2000 | Hartig et al. |
| 6,159,607 A | 12/2000 | Hartig et al. |
| 6,280,834 B1 | 8/2001 | Veerasamy et al. |

OTHER PUBLICATIONS

"High Temperature Corrosion", Per KOFSTAD, Dept. of Chemistry, Univ. of Oslo, Norway, 1998, pp. 360–371 (no month).

Technical Digest 1995, "Optical Interference Coatings", Wolfe et al. vol. 17, pps. 115–117 (no month).

HEAT TREATABLE COATED ARTICLE WITH ANTI-MIGRATION BARRIER BETWEEN DIELECTRIC AND SOLAR CONTROL LAYER PORTION, AND METHODS OF MAKING SAME

This application is a continuation-in-part (CIP) of U.S. patent application Ser. No. 09/858,873, filed May 17, 2001 (the parent application), the disclosure of which is hereby incorporated herein by reference.

This invention relates to coated articles including a layer structure of barrier/metal(or mostly metal)/barrier, and a method of making the same. This layer structure may be used by itself, or more preferably as only a component of an overall coating or layer system. In certain embodiments, a single sputtering target (e.g., cathode target) is used to make this layer structure. In these and/or other embodiments of the invention, the resulting coated article has approximately the same color characteristics as viewed by the naked eye before and after heat treatment (e.g., thermal tempering). Such coated articles may be used in insulating glass (IG) window units, vehicle windows, and/or other suitable applications.

BACKGROUND AND SUMMARY OF THE INVENTION

The need for color matchability of coated articles (before heat treatment vs. after heat treatment) is known. Glass substrates are often produced in large quantities and cut to size in order to fulfill the needs of a particular situation such as a new multi-window and door office building, vehicle window needs, etc. It is often desirable in such applications that some of the windows and/or doors be heat-treated (i.e., tempered, heat strengthened or bent), while others need not be. Office buildings typically employ IG units and/or laminates for safety and/or thermal control. It is desirable that the units and/or laminates which are heat treated (HT) substantially match their non-heat treated counterparts (e.g., with regard to color, reflectance, and/or the like) for architectural and/or aesthetic purposes.

U.S. Pat. No. 5,376,455 discloses a coated article including: glass/$Si_3N_4$/NiCr/Ag/NiCr/$Si_3N_4$. Unfortunately, the coating system of the '455 patent is not sufficiently color matchable after heat treatment with its non-heat-treated counterpart. In other words, the coating system of the '455 patent has a rather high ΔE value. This means that, unfortunately, two different coated articles with different coatings (one to be heat treated, the other not to be) must be made for customers who want their heat-treated and non-heat-treated coated articles to approximately match colorwise as viewed by the naked eye.

As with the '455 patent, it has mostly been possible to achieve matchability only by providing two different layer systems, one of which is heat treated (HT) and the other is not. The necessity of developing and using two different layer systems to achieve matchability creates additional manufacturing expense and inventory needs which are undesirable.

However, commonly owned U.S. Pat. No. 5,688,585 discloses a solar control coated article including glass/$Si_3N_4$/NiCr/$Si_3N_4$, wherein matchability is achieved with a single layer system. An object of the '585 patent is to provide a sputter coated layer system that after heat treatment is matchable colorwise with its non-heat-treated counterpart. However, the '585 patent uses a heat treatment (HT) of only three (3) minutes (col. 10, line 55). Longer heat treatments are often desired in order to attain better tempering or HT characteristics. Unfortunately, it has been found that with longer HT times the coatings of the '585 patent cannot maintain low ΔE values and thus lose color matchability. In particular, it has been found that in coatings such as those of the '585 patent, ΔE values jump significantly upward after HT for 4–5 minutes at a temperature of from about 600 to 800 degrees C.

Consider the following layer stack (see Comparative Example below): glass/$Si_3N_4$/NiCr/$Si_3N_4$, where the underlayer of $Si_3N_4$ is about 50–70 Å (angstroms) thick, the NiCr layer is about 325 Å thick, and the overcoat of $Si_3N_4$ is about 210–310 Å thick. As explained in the Comparative Example below, this coated article has a rather high transmissive ΔE* value of about 5.9 after heat treatment (HT) at 625 degrees C for ten (10) minutes. This high transmissive ΔE value means that a HT version of the '585 coated article does not approximately match colorwise non-heat-treated counterpart versions with regard to transmissive color after 10 minutes of HT.

COMPARATIVE EXAMPLE

The following Comparative Example layer system was provided on about a 6.0 mm thick clear soda-lime-silica glass substrate 1, and was: silicon nitride/NiCr/silicon nitride. A Leybold Terra-G six-chamber sputter coating apparatus was used to sputter the coating onto the glass substrate. Five cathodes were in each chamber, so there were a total of 30 cathode targets in the sputter coater (not all were used). Cathode numbering utilizes the first digit to refer to the coater chamber, and the second digit to refer to the cathode position in that chamber. For example, cathode #42 was the second cathode (second digit) in the fourth (first digit) sputter chamber. Cathode #s 42, 55 and 61 were dual C-Mag type cathodes; and cathode #s 44 and 45 were planar cathodes. Below, "*" means Al content of approximately 10%. The line speed was 3.5 meters per minute (m/min.). All gas flows (i.e., Ar and N) are presented in units of sccm. Voltage is measured in terms of volts, and frequency in terms of kHz. Pressure is measured in hPa, and power in kW. T-gas refers to trim (or tuning) gas used to individually adjust gas flows along cathode length to make corrections regarding layer thickness uniformity (all T-gas was at 100 sccm). C % refers to the percentage (%) of trim gas introduced at the center, while PS % refers to the percentage of the trim gas introduced at the pump side, and VS % refers to the percentage of the trim or tuning gas introduced at the viewer side. The NiCr targets were approximately 80/120 NiCr.

| Comparative Example Sputtering Data | | | | | | | | | | | |
|---|---|---|---|---|---|---|---|---|---|---|---|
| Cathode | Target | Power | Voltage | Pressure | Ar | $N_2$ | Freq. | T-Gas | C % | PS % | VS % |
| #42 | Si/Al* | 11.0 | 192 | 2.11E−03 | 200 | 71.4 | 24.3 | N | 5% | 45% | 50% |
| #44 | Ni/Cr | 38.46 | 411 | 3.15E−03 | 200 | 0 | DC | Ar | 80% | 10% | 10% |

-continued

Comparative Example Sputtering Data

| Cathode | Target | Power | Voltage | Pressure | Ar | N$_2$ | Freq. | T-Gas | C % | PS % | VS % |
|---|---|---|---|---|---|---|---|---|---|---|---|
| #45 | Ni/Cr | 38.30 | 412 | 2.79E−03 | 200 | 0 | C | Ar | 70% | 20% | 10% |
| #55 | Si/Al* | 44.68 | 308 | 3.40E−03 | 200 | 268.1 | 27.1 | N | 5% | 45% | 50% |
| #61 | Si/Al* | 44.72 | 299 | 3.98E−03 | 202 | 268.3 | 27.2 | N | 5% | 45% | 50% |

After being sputtered onto glass substrate 1 as set forth above, the resulting coated article of the Comparative Example was tested and found to have the following characteristics monolithically (not in an IG unit), where the heat treatment (HT) involved heating the monolithic product at about 625 degrees C for about 10 minutes. It is noted that a* and b* color coordinate values are in accordance with CIE LAB 1976, Ill. C 2 degree observer technique, and Δa* and Δb* are in terms of absolute value. Moreover, sheet resistance ($R_s$) is in units of ohms per square as is known in the art.

Comparative Example (measurements before/after HT)

| Value/Measurement | (Pre-HT) | (Post-HT) |
|---|---|---|
| Transmission (TY) %: | 8.02 | 9.71 |
| $L^*_T$: | 34.02 | 37.32 |
| $a^*_T$: | 0.03 | −1.5 |
| $b^*_T$: | −8.21 | −3.52 |
| Δ$a^*_T$ (transmissive): | | 1.53 |
| Δ$E^*_T$ (transmissive): | | 5.9 |
| Glass side | | |
| Reflectance ($R_G Y$ %): | 43.58 | 38.41 |
| $L^*_G$: | n/a | 71.94 |
| $a^*_G$: | n/a | −2.06 |
| $b^*_G$: | n/a | 2.18 |
| Film side | | |
| Reflectance ($R_F Y$ %): | 38 | 30.1 |
| $L^*_F$: | 68.02 | 61.74 |
| $a^*_F$: | −0.32 | 1.12 |
| $b^*_F$: | 21.0 | 18.65 |
| ΔE* (film side) | | 6.86 |
| $R_s$ (ohms/sq.): | 38.8 | 41.9 |

As can be seen above, the Comparative Example experienced a rather high transmissive ΔE* value of 5.9 and a rather high film side reflective ΔE* value of 6.86 (evidencing that the coating is not color stable upon HT). It is believed that these high ΔE* value(s) associated with the coating of the Comparative Example are caused for at least the following reasons. Prior to heat treatment (HT), the vast majority of the Ni is located in the NiCr layer and the vast majority of the Si and N from the upper Si$_3$N$_4$ layer is located in that upper layer. However, when the Comparative Example coated article is heat treated (HT) as discussed above, a significant portion of the Ni from the NiCr layer migrates (of diffuses) into the upper Si$_3$N$_4$ layer (see parent application). Additionally, upon HT a significant portion of the Si and N from the upper Si$_3$N$_4$ layer migrate(s) into the NiCr layer. In other words, the interface between the metal NiCr layer and the upper dielectric Si$_3$N$_4$ layer becomes blurred and non-distinct due to HT.

Unfortunately, the aforesaid migrations of the Si, N, and Ni from their pre-HT positions to their post-HT positions (due to HT) causes significant color shifting to occur and thus explains the large ΔE* value(s) associated with the Comparative Example.

In view of the above, it will be apparent to those skilled in the art that there exists a need for a coating or layer system that has a low ΔE (or ΔE*) value(s) and thus good color matchability characteristics after heat treatment (HT). It is a purpose of this invention to fulfill the above-listed need, and/or other needs which will become more apparent to the skilled artisan once given the following disclosure.

An attempt has been made to overcome the aforesaid problem with the aforesaid silicon nitride/NiCr/silicon nitride layer system (see Comparative Example) by nitriding the NiCr layer. While this significantly reduces color shift upon HT and is thus desirable in certain embodiments of this invention, it can reduce the deposition rate of the NiCr layer (e.g., by 20% or so). Moreover, this latter technique of simply nitriding the NiCr layer tends to reduce the metallic nature of the central NiCr layer thereby leading to a less sharp appearance of the resulting coated article.

In the parent application, a barrier layer (e.g., NiCrO$_x$) is introduced between the silicon nitride layer and the NiCr layer, on one or both sides of the NiCr layer. As will be appreciated by those skilled in the art, the term NiCrO$_x$ as used herein means that the Ni and/or Cr may be at least partially oxided. This NiCrO$_x$ barrier layer, which is at least partially oxidized/oxided, enables color shift upon HT to be significantly reduced thereby rendering this approach acceptable in certain embodiments of the instant invention. Color shift upon HT is reduced (i.e., ΔE* is lowered) because the barrier layer reduces interdiffusion of Ni and the like from occurring upon HT, so that the metallic nature of the NiCr is better preserved. The provision of this oxide barrier layer also improves corrosion resistance. However, this approach requires a three layer stack (i.e., NiCrO$_x$/NiCr/NiCrO$_x$) to replace a single layer (i.e., NiCr), so that two additional cathodes (or targets are required). Thus, while this approach is acceptable according to certain embodiments of this invention, it does require additional cathodes/targets and thus can be improved upon as discussed below.

An object of this invention is to provide a coating or layer system that has good color stability (i.e., a low ΔE* value(s)) with heat treatment (HT).

Another object of this invention is to provide a coating or layer system having a ΔE* value(s) (e.g., transmissive and/or glass side reflective) no greater than 5.0 upon heat treatment (HT). Such HT may be, for example and without limitation, at a temperature of at least about 580 or 600 degrees C for a period of time of at least 5 minutes (more preferably at least 7 minutes, and most preferably at least 9 minutes).

Another object of this invention is to provide a diffusion/migration prevention layer or layer portion (i.e., anti-migration layer or layer portion) between a dielectric layer (e.g., silicon nitride) and a solar control layer or layer portion (e.g., NiCr) in order to reduce elemental migration and improve color stability upon HT so as to enable the resulting coated article to have low ΔE value(s). The anti-migration layer or layer portion may include chromium oxide, $NiCrO_x$, and/or any other suitable material such as another metal oxide.

Another object of this invention is to sputter coat a layer structure including metal oxide/metal/metal oxide using a single sputtering target or cathode.

Another object of this invention is to sputter coat a layer structure including $NiCrO_x$/NiCr/$NiCrO_x$ using a single sputtering target or cathode. This layer structure is thus part of the same layer (which is oxided/oxidized differently at different portions thereof) in certain embodiments of this invention. In certain optional embodiments of this invention, this layer structure may also be at least partially nitrided.

Another object of this invention is to fulfill one or more of the above-listed objects and/or needs.

According to certain example embodiments of this invention, by at least forming an anti-migration layer or layer portion between a solar control layer or layer portion and a dielectric layer, migration of N, Cr, and/or Ni (or other relevant material(s) depending upon the materials used for the dielectric and solar control layers) can be reduced during HT thereby enabling the resulting coated article to be more color-stable with HT (i.e., have lower $\Delta E^*$ value(s)). Less element migration during HT results in better color stability upon HT, and thus lower $\Delta E^*$ value(s). In embodiments where the anti-migration layer or layer portion(s) is/are deposited using the same target as is used to deposit the solar control layer or layer portion, hardware and thus cost/time can be reduced.

In certain example embodiments of this invention, one or more of the above-listed objects and/or needs is fulfilled by providing a coated article comprising: first and second dielectric layers supported by a substrate; a layer structure provided between the first and second dielectric layers, said layer structure including an at least partially oxidized top layer portion, a central layer portion and an at least partially oxidized bottom layer portion, wherein the central layer portion is more metallic than the top and bottom layer portions; and wherein the coated article has a transmissive $\Delta E^*$ value no greater than 5.0 upon heat treatment. The central layer portion may or may not contact the top/bottom layer portions in different embodiments (i.e., further oxidation grading may take place therebetween).

In certain other embodiments of this invention, one or more of the above-listed objects and/or needs may be fulfilled by providing a coated article comprising: first and second dielectric layers supported by a substrate; an oxidation graded layer located between the first and second dielectric layers, the oxidation graded layer having a top side and a bottom side; and wherein the oxidation graded layer is oxidation graded to become gradually less oxidized from the bottom side of the layer to a central portion of the layer and then to become gradually more oxidized from the central portion of the layer to the top side of the layer.

In certain other embodiments of this invention, one or more of the above-listed objects and/or needs may be fulfilled by providing a method of making a coated article, the method comprising: providing a sputtering target comprising at least one metal; sputtering a layer structure on a substrate using the target; and wherein the sputtering includes using from 0.1 to 4.0 sccm oxygen gas per kW power (sccm/kW) so that the resulting layer structure from using the target is oxidation graded to include top and bottom portions which are more oxidized than a central portion.

This invention will now be described with respect to certain embodiments thereof as illustrated in the following drawings, wherein:

IN THE DRAWINGS

Figure 5:
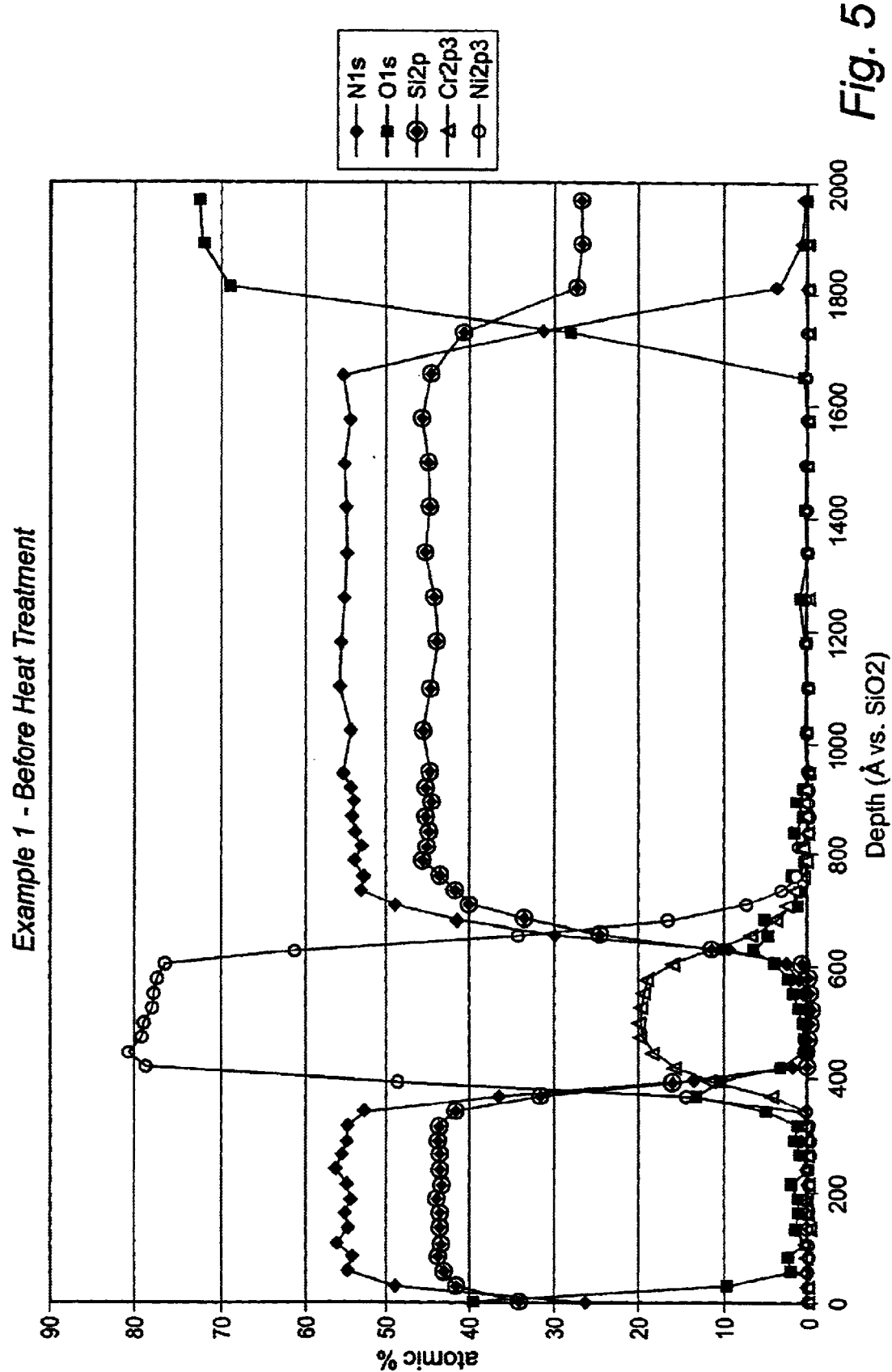

FIG. 5 is an x-ray photoelectron spectroscopy (XPS) graph illustrating the atomic % of components N, O, Si, Cr, and Ni throughout the thickness of a layer structure of Example 1 of the instant invention before HT, where the "depth" axis refers to the depth into the coating and/or substrate from the exterior surface thereof as compared to the depth into a conventional $SiO_2$ layer that would have been achieved over the same period of time (i.e., the Å depth is not actual depth, but instead is how deep into a reference $SiO_2$ layer sputtering would have reached over the corresponding time).

Figure 6:
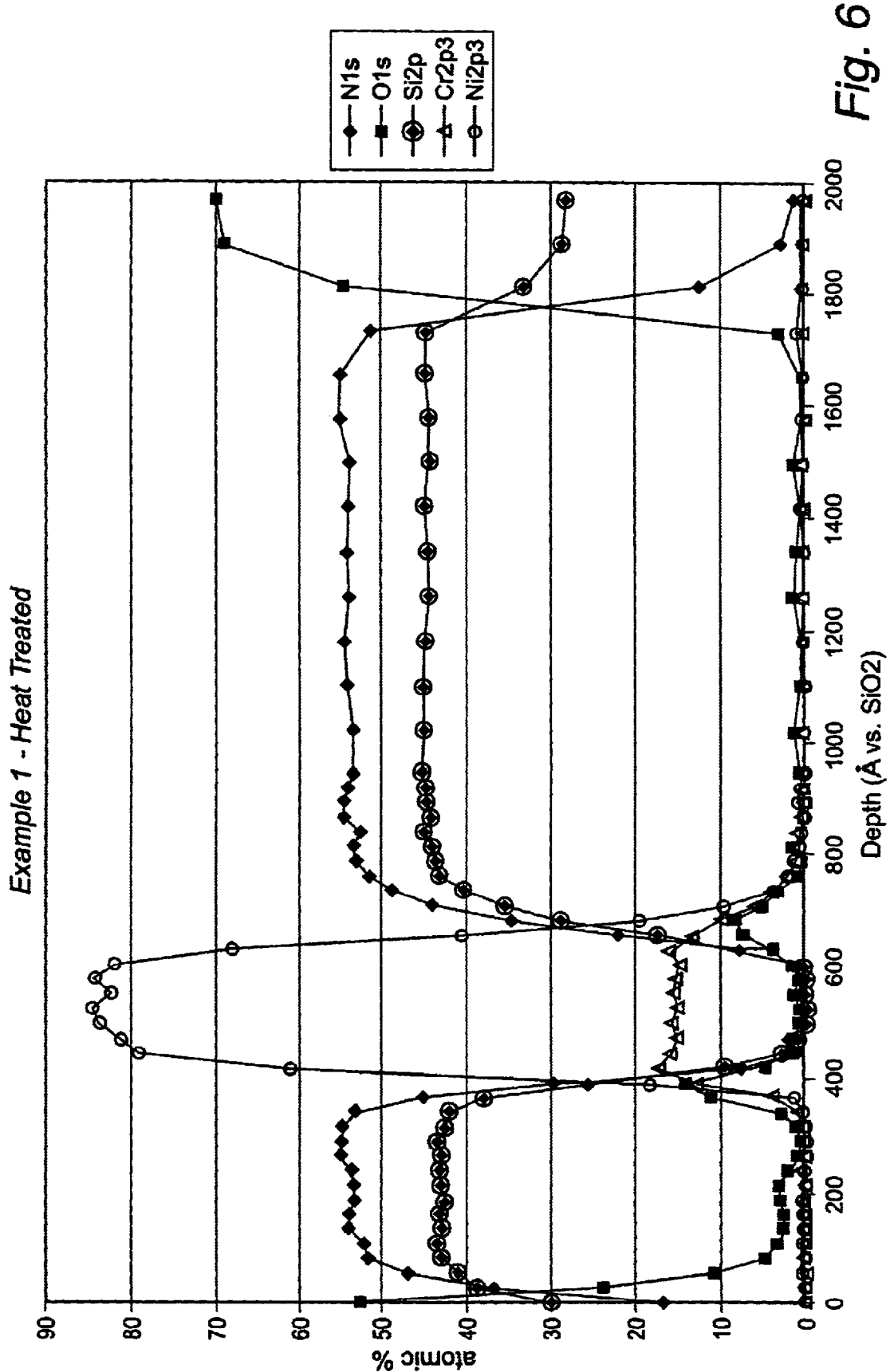

FIG. 6 is an x-ray photoelectron spectroscopy (XPS) graph illustrating the atomic % of components N, O, Si, Cr, and Ni throughout the thickness of a layer structure of Example 1 of the instant invention after HT, where the "depth" axis refers to the depth into the coating and/or substrate from the exterior surface thereof as compared to the depth into a conventional $SiO_2$ layer that would have been achieved over the same period of time (i.e., the A depth is not actual depth, but instead is how deep into a reference $SiO_2$ layer sputtering would have reached over the corresponding time).

Figure 7:
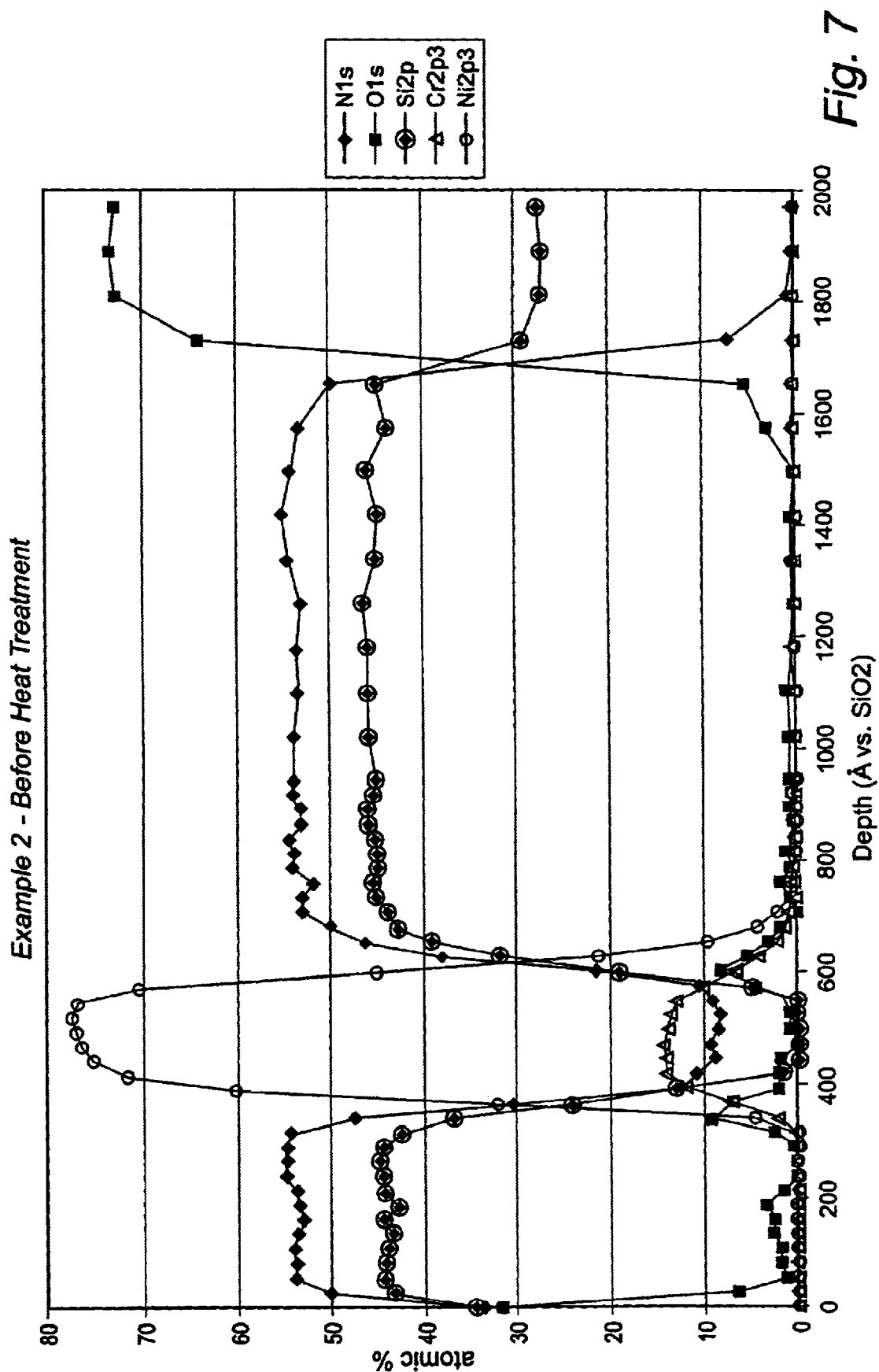

FIG. 7 is an x-ray photoelectron spectroscopy (XPS) graph illustrating the atomic % of components N, O, Si, Cr, and Ni throughout the thickness of a layer structure of Example 2 of the instant invention before HT, where the "depth" axis refers to the depth into the coating and/or substrate from the exterior surface thereof as compared to the depth into a conventional $SiO_2$ layer that would have been achieved over the same period of time (i.e., the Å depth is not actual depth, but instead is how deep into a reference $SiO_2$ layer sputtering would have reached over the corresponding time).

Figure 8:
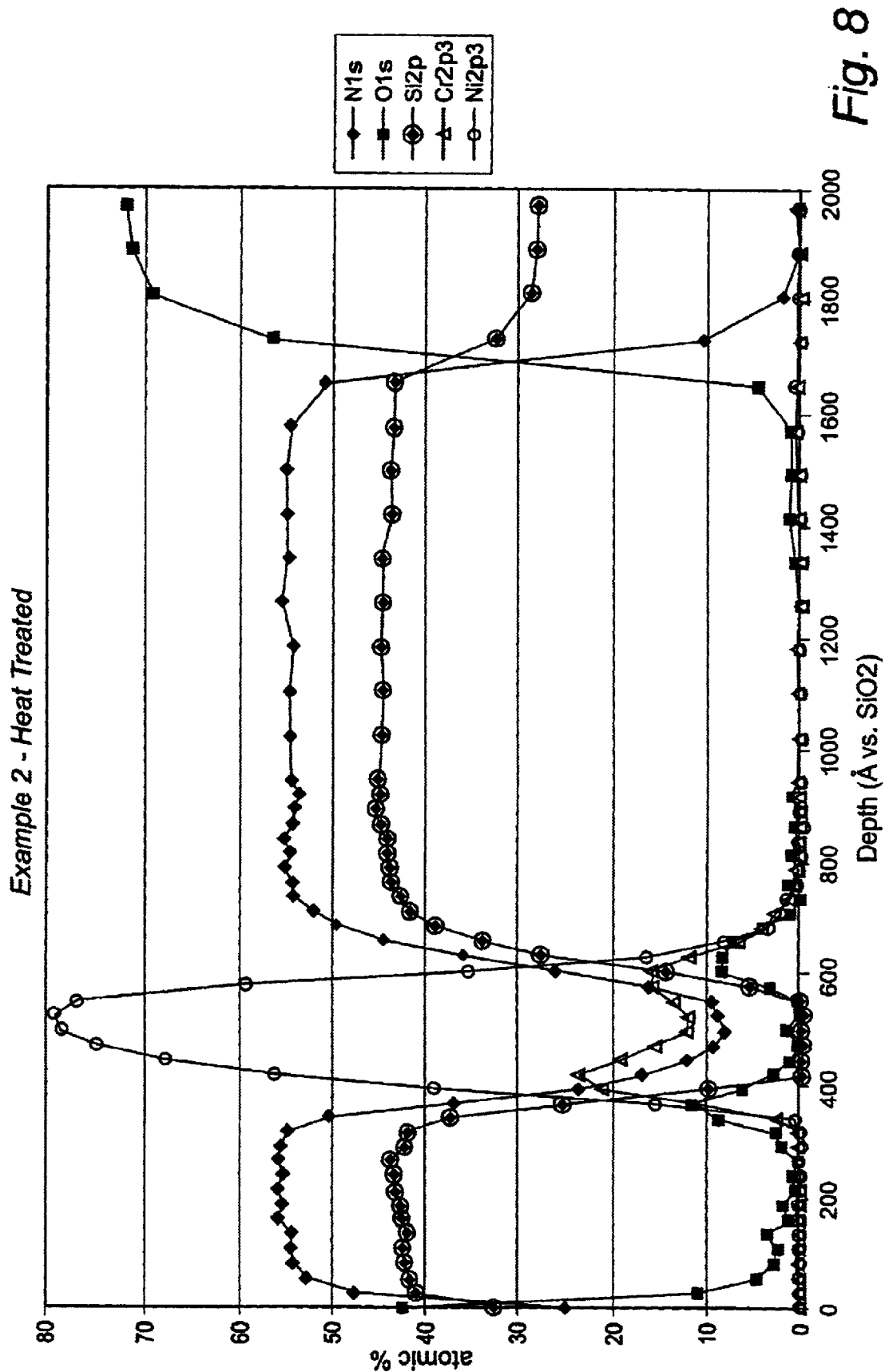

FIG. 8 is an x-ray photoelectron spectroscopy (XPS) graph illustrating the atomic % of components N, O, Si, Cr, and Ni throughout the thickness of a layer structure of Example 2 of the instant invention after HT, where the "depth" axis refers to the depth into the coating and/or substrate from the exterior surface thereof as compared to the depth into a conventional $SiO_2$ layer that would have been achieved over the same period of time (i.e., the A depth is not actual depth, but instead is how deep into a reference $SiO_2$ layer sputtering would have reached over the corresponding time).

DETAILED DESCRIPTION OF CERTAIN EXAMPLE EMBODIMENTS OF THE INVENTION

Referring now more particularly to the accompanying drawings where like parts/elements/layers indicate like parts/elements/layers in the several views.

Certain embodiments of this invention provide a coating or layer system that may be used in applications such as vehicle windows, architectural windows (monolithic or IG type), and/or other suitable applications. Certain embodiments of this invention provide a layer system that has excellent color stability (i.e., a low value of ΔE* and/or a low value of Δa*; where Δ is indicative of change in view of HT) with heat treatment (e.g., thermal tempering, bending, or thermal heat strengthening) monolithically and/or in the context of dual pane environments such as IG units or windshields. Such heat treatments (HTs) often necessitate heating the coated substrate to temperatures from about 580° C. up to about 800° C. for at least about 5 minutes.

In certain embodiments of this invention, the coating or layer system includes a layer stack including a metal layer (e.g., NiCr) sandwiched between first and second oxide layers (e.g., $NiCrO_x$), where each of the different layers is made using a different cathode or target. In this regard, see the parent application which describes, for example, a layer stack of $NiCrO_x$/NiCr/$NiCrO_x$ sandwiched between first and second dielectrics, wherein a different target is used to form each of these three layers.

Other embodiments of this invention provide a layer structure including meal oxide/metal/metal oxide in one layer that is made using a single sputtering target, or a single type of target (see FIGS. 1–8 herein). In such embodiments, the metal may be NiCr, Ni, Cr, Nb, Ti, Al, Zn, Ta, any combination thereof, or any other suitable metal (the term metal includes alloys of two or metals herein), while the metal oxide is an oxide of the same metal. This layer structure may, in certain example embodiments, utilize a single layer which includes different amounts of oxidation so that a central portion of the layer is less oxidized (e.g., is a metal, or more metallic) than upper and lower portions of the layer. In other words, the upper and lower portions of the layer are significantly more oxidized/oxed (i.e., at least 20% more oxidized) than the central portion of the layer.

Figure 1:
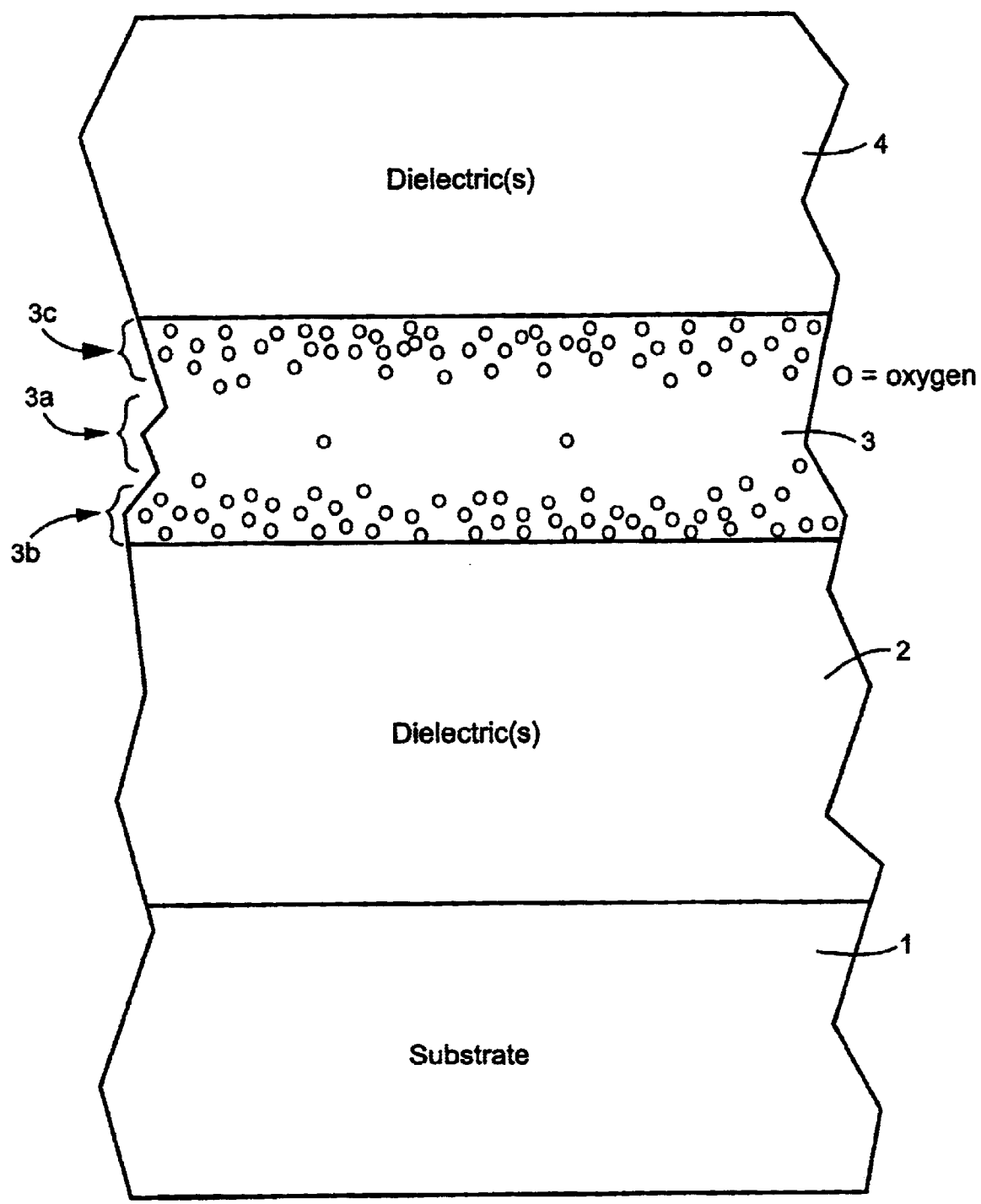
FIG. 1 is a partial side cross sectional view of a coated article according to an embodiment of this invention.

FIG. 1 is a side cross sectional view of a coated article according to an example embodiment of this invention. The coated article includes substrate 1 (e.g., clear, green, bronze, grey, blue, or blue-green glass substrate from about 1.0 to 12.0 mm thick), first dielectric layer(s) 2, oxidation graded layer 3 that is more metallic at the central layer portion 3a than at the respective bottom and top layer portions 3b and 3c thereof, and second dielectric layer(s) 4. The bottom and top layer portions 3b and 3c may or may not contact central layer portion 3a in different embodiments of this invention (e.g., oxidation grading of layer 3 may take place between the central layer portion 3a and one or both of the layer portions 3b, 3c).

Dielectric layers 2 and 4 may be of or include silicon nitride (e.g., $Si_3N_4$ or a Si-rich type silicon nitride), an oxide of titanium (e.g., $TiO_2$), titanium nitride, zirconium nitride, zinc oxide, silicon oxynitride, tin oxide, zirconium oxide, aluminum oxide, silicon oxide, or the like. Meanwhile, oxidation graded layer 3 is more metallic in the central layer portion 3a thereof than at the bottom/top layer portions 3b/3c thereof as shown in FIG. 1. Thus, the more metallic (e.g., purely metallic or mostly metallic) central portion 3a of solar control layer 3 provides functions such as ultraviolet (UV) and/or infrared (IR) reflection and/or absorption, while oxide layer portions 3b and 3c which are at least partially oxided function as protective and/or anti-migration layer portions. For example, oxide layer portions 3b and 3c of layer 3 reduce migration of metal (e.g., Ni) from central portion 3a of layer 3 to dielectric layer(s) 2 and/or 4 upon heat treatment (HT). The oxidation grading of layer 3 is achieved using only a single sputtering target by using only a small amount of oxygen in sputtering the layer, as will be explained in more detail below.

In example embodiments where the metal of layer 3 is NiCr (i.e., a NiCr inclusive sputtering target is used to form layer 3), then central layer portion 3a is mostly NiCr (i.e., no more than 30% oxided) while layer portions 3b and 3c are of or include $NiCrO_x$. In other embodiments where the metal of layer 3 is Cr (i.e., a Cr target is used in sputtering layer 3), then layer central portion 3a is mostly Cr while anti-migration layer portions 3b and 3c are of or include $CrO_x$. In a similar manner, when the metal of layer 3 is Ti (i.e., a Ti target is used in sputtering layer 3), then central layer portion 3a is mostly Ti (i.e., no more than 30% oxided), while layer portions 3b and 3c are of or include $TiO_x$ (e.g., where x is from 0.5 to 2.0). Anti-migration oxide layer portions 3b and/or 3c may be fully or only partially oxidized in different embodiments of this invention.

It is noted that when the metal (the term metal herein includes metal alloys of two or more metals) of layer 3 is NiCr, different types of NiCr inclusive sputtering targets may be used. For example a target of 50/50 Ni/Cr may be used in certain embodiments, or a target of 80/20 Ni/Cr (or even 90/10 Ni/Cr) may be used in other embodiments (these NiCr inclusive sputtering targets may or may not include other elements such as Fe, stainless steel or the like).

With respect to advantages, it has been found that coatings according to this invention can be made more color stable with heat treatment (HT) due to the presence of anti-migration layer portions 3b and/or 3c located between metal portion 3a and the respective dielectrics 2, 4. For example, in embodiments where the metal of layer 3 is NiCr (so that layer portion 3a is mostly NiCr and portions 3b, 3c are of or include $NiCrO_x$) and dielectrics 2, 4 are silicon nitride, then anti-migration layer portions 3b and 3c enable migration of N, Si, and/or Ni to be reduced during HT thereby enabling the resulting coated article to be more color-stable with HT (i.e., have a lower ΔE* value(s)). Less element migration during or caused by HT results in better color stability upon HT, and thus lower ΔE* values. In certain embodiments, it is also believed that the provision of oxide bottom and top layer portions 3b, 3c may also act to stabilize the microstructure of the metal in central layer portion 3a; so that color shift with HT is reduced and the nature of central layer portion 3a is better preserved so that IR reflection characteristics and shading coefficient characteristics can be improved. It has also been found that the provision of bottom and top layer portions 3b, 3c reduces the likelihood of adhesion problems and thereby may improve chemical and/or mechanical durability of coating (i.e., there is no sharp interface between the metal portion 3a and the oxide barrier portions 3b, 3c, which reduces delamination concerns). Moreover, in embodiments where a single target is used to form layer 3, the deposition rate of the layer 3 remains high (e.g., approximately the same rate as a metal layer) even though oxides are being formed.

In certain example embodiments of this invention, dielectric(s) layer 2 may be from 50–1,500 Å thick, more preferably from 70–900 Å thick, and most preferably from about 100–800 Å thick. In certain example embodiments, metal (i.e., all metal or mostly metal) central layer portion 3a of layer 3 may be from about 10–500 Å thick, more preferably from about 20–350 Å thick, and most preferably from about 50–300 Å thick. In certain example embodiments of this invention, oxided layer portions 3b and 3c are significantly thinner than layer portion 3a, and layer portions 3b and 3c may each be from 5–100 Å thick, more preferably from 5–50 Å thick, and most preferably from 5–25 Å thick. Generally speaking, layer 3 (including portions 3a–3c) may be from about 20–900 Å thick, more preferably from about 30–500 Å thick, and most preferably from about 60–400 Å thick. In certain example embodiments of this invention, dielectric(s) layer 4 may be from 100–1,000 Å thick, more preferably from 100–500 Å thick, and most preferably from about 150–350 Å thick.

In certain example embodiments of this invention, anti-migration layer portion(s) 3b and/or 3c may be at least 50% oxidized, more preferably at least 70% oxidized, and most preferably at least 80% oxidized (even 100% oxidized in certain embodiments). Meanwhile, more metallic central layer portion 3a is preferably no more than 30% oxided/oxidized, more preferably no more than 10% oxidized, and most preferably no more than 5% oxidized. In certain example embodiments, layer portion 3a may be purely metallic though this may be difficult to achieve. It is noted that progressive oxidation grading of layer 3 may take place or exist between the central layer portion 3a and one or both of layer portions 3b, 3c, so that layer portion 3a may or may not actually contact layer portion(s) 3b and/or 3c in different embodiments of this invention.

Other layer(s) below or above the illustrated coating or layer system 2–4 may also be provided. Thus, while the layer system 2–4 shown in FIG. 1 is "on" or "supported by" substrate 1 (directly or indirectly), other layer(s) may be provided therebetween. Thus, for example, other layer(s) may be provided between layer system 2–4 and substrate 1 in certain embodiments of this invention. Also, other layer(s) may be provided over layer system 2–4 in certain embodiments of this invention. Moreover, while layer 3 is located between dielectric layers 2 and 4, other layers may be provided between layer 3 and layer 2 (or layer 4) in certain embodiments of this invention. Thus, the term "between" as used herein does not mean that a layer "between" other layers must contact those other layers. Moreover, the term "on" as used herein simply means that a layer "on" a substrate is supported by the substrate regardless of whether other layer(s) are located between the substrate and that layer.

In certain exemplary embodiments, the color stability with heat treatment (HT) due at least to anti-migration layer(s) portion(s) 3b and/or 3c results in substantial match-ability between heat-treated and non-heat treated versions of the coating or layer system of FIG. 1. In other words, in monolithic and/or IG applications, in certain embodiments of this invention two glass substrates having the same coating system thereon (one HT after deposition and the other not HT) appear to the naked human eye to look substantially the same.

The values $\Delta E^*$ and $\Delta a^*$ are important in determining whether or not there is matchability, or substantial color matchability or color stability upon HT, in the context of this invention. Color herein is described by reference to the conventional $a^*$, $b^*$ values. The term $\Delta a^*$ is simply indicative of how much color value $a^*$ changes due to HT. The same is true for $b^*$.

The term $\Delta E^*$ (and $\Delta E$) is well understood in the art and is reported, along with various techniques for determining it, in ASTM 2244-93 as well as being reported in Hunter et. al., *The Measurement of Appearance*, $2^{nd}$ Ed. Cptr. 9, page 162 et seq. [John Wiley & Sons, 1987]. As used in the art, $\Delta E^*$ (and $\Delta E$) is a way of adequately expressing the change (or lack thereof) in reflectance and/or transmittance (and thus color appearance, as well) in an article after or due to HT. $\Delta E$ may be calculated by the "ab" technique, or by the Hunter technique (designated by employing a subscript "H"). $\Delta E$ corresponds to the Hunter Lab L, a, b scale (or $L_h$, $a_h$, $b_h$).

Similarly, $\Delta E^*$ corresponds to the CIE LAB Scale $L^*$, $a^*$, $b^*$. Both are deemed useful, and equivalent for the purposes of this invention. For example, as reported in Hunter et. al. referenced above, the rectangular coordinate/scale technique (CIE LAB 1976) known as the $L^*$, $a^*$, $b^*$ scale may be used, wherein:

$L^*$ is (CIE 1976) lightness units $a^*$ is (CIE 1976) red-green units $b^*$ is (CIE 1976) yellow-blue units and the distance $\Delta E^*$ between $L^*_o a^*_o b^*_o$ and $L^*_1 a^*_1 b^*_1$ is:

$$\Delta E^* = [(\Delta L^*)^2 + (\Delta a^*)^2 + (\Delta b^*)^2]^{1/2} \tag{1}$$

where:

$$\Delta L^* = L^*_1 - L^*_o \tag{2}$$

$$\Delta a^* = a^*_1 - a^*_o \tag{3}$$

$$\Delta b^* = b^*_1 - b^*_o \tag{4}$$

where the subscript "o" represents the coating (or coated article) before heat treatment and the subscript "1" represents the coating (coated article) after heat treatment; and the numbers employed (e.g., $a^*$, $b^*$, $L^*$) are those calculated by the aforesaid (CIE LAB 1976) $L^*$, $a^*$, $b^*$ coordinate technique. In a similar manner, $\Delta E$ may be calculated using equation (1) by replacing $a^*$, $b^*$, $L^*$ with Hunter Lab values $a_h$, $b_h$, $L_h$. Also within the scope of this invention and the quantification of $\Delta E^*$ are the equivalent numbers if converted to those calculated by any other technique employing the same concept of $\Delta E^*$ as defined above.

After heat treatment (HT), in certain embodiments of this invention layer systems provided on clear monolithic glass substrates have color stability characteristics $\Delta E^*$ and $\Delta a^*$ as follows, when viewed from the glass (G) side (as opposed to the layer/film side) of the coated article:

| Reflective Glass Side Color Stability (e.g., $\Delta E^*_G$) Upon HT | | |
| --- | --- | --- |
| General | Preferred | Most Preferred |
| $\Delta E^*_G$ is <=5.0 | <=3.5 | <=2.0 |
| $\Delta a^*_G$ is <=1.5 | <=1.0 | <=0.5 |
| $\Delta b^*_G$ is <=3.0 | <=2.0 | <=1.0 |

With respect to film (F) side color stability upon HT, in certain embodiments of this invention layer systems provided on clear monolithic glass substrates have color stability characteristics $\Delta E^*$ and $\Delta a^*$ as follows, when viewed from the film (F) side (as opposed to the glass side) of the coated article:

| Reflective Film Side Color Stability (e.g., $\Delta E^*_F$) Upon HT | | |
| --- | --- | --- |
| General | Preferred | Most Preferred |
| $\Delta E^*_F$ is <=5.0 | <=4.0 | <=3.0 |
| $\Delta a^*_F$ is <=2.0 | <=1.0 | <=0.5 |
| $\Delta b^*_F$ is <=3.0 | <=2.0 | <=1.0 |

With respect to transmissive (T) side color stability upon HT, in certain embodiments of this invention layer systems provided on clear monolithic glass substrates have transmissive color stability characteristics ΔE* and Δa/b* as follows:

| Transmissive Color Stability (e.g., ΔE*$_T$) Upon HT | | | |
|---|---|---|---|
| | General | Preferred | Most Preferred |
| ΔE*$_T$ is | <=5.0 | <=3.0 | <=2.0 |
| Δa*$_T$ is | <=2.0 | <=1.0 | <=0.5 |
| Δb*$_T$ is | <=3.0 | <=2.0 | <=1.0 |

Accordingly, as shown above, coated articles according to certain embodiments of this invention have low ΔE* values (glass side, film side, and/or transmissive) due to the presence of anti-migration layer portions 3b and 3c on opposite sides of more metallic IR reflecting layer portion 3a. When one or more of the aforesaid ΔE* values is/are achieved, matchability results. It is noted that Δa* and Δb* values are reported herein in terms of absolute value.

Figure 2:
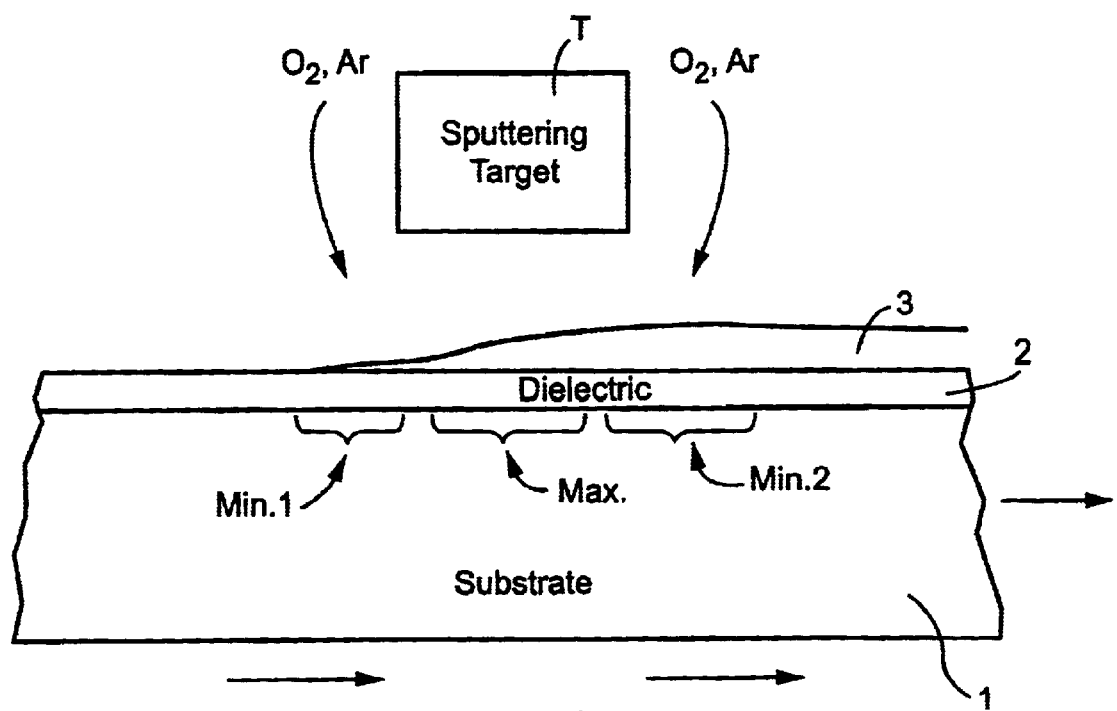
FIG. 2 is a schematic diagram illustrating one example way in which a single cathode or sputtering target can be used to deposit the central layer of FIG. 1, according to an embodiment of this invention.

Referring to FIG. 2, an example method of making the coated article of FIG. 1 will now be described (note: in FIG. 2 the thickness of layer 3 increases from left to right because the substrate is proceeding in that direction at a point in time beneath the target in the direction of the horizontal arrows). According to the FIG. 2 technique, only one target (or cathode) T is used to deposit oxidation graded layer 3 that has each of layer portions 3a–3c. In an in-line sputtering apparatus, the deposition rate of a layer starts very slowly when a part of the underlying substrate 1 approaches the metal cathode/target T (see first "min. 1" region in FIG. 2), and gradually reaches a peak layer forming rate as that part of the substrate makes its way to a position directly under the cathode/target (see max. region in FIG. 2). After that part of the substrate 1 leaves a position under the cathode/target T (see max. region), the deposition rate for the layer gradually diminishes as that part of the substrate 1 reaches a proceeds through the second "min. 2" region. Taking this into account, FIG. 2 illustrates that the layer 3 structure 3a–3c of FIG. 1 can be made by introducing only a very small amount/dose of oxygen gas into the system near the metal cathode/target T around both sides thereof. As shown in FIG. 2, argon (Ar) and oxygen (O$_2$) gases are introduced around each side of the cathode/target T. By introducing a very small amount of oxygen, and a relatively large amount of argon and/or other inert gas, the layer structure of FIG. 2 can be formed.

Still referring to FIGS. 1–2, due to the different deposition rate(s) between the different regions (i.e., min. vs. max. regions), the layer 3 grows at a very slow rate in the "min." regions, and at a very fast or maximum rate in the "max." region under the cathode/target T. As a result, even though the amount of oxygen gas used/introduced proximate the cathode/target T is relatively small, large amounts of oxygen is/are incorporated into the layer in the "min." regions in order to form at least partially oxided layer portions 3b and 3c. In the "max." region directly under the cathode/target T, since the deposition rate here is high, this portion of the layer 3 contains very little oxygen. Accordingly, it can be seen that lower/bottom oxide layer portion 3b is formed in the first "min. 1" region before the substrate reaches the cathode/target T, more metallic layer portion 3a is then formed in the "max." region as that part of the substrate 1 proceeds to a position under the cathode/target T, and upper/top oxide layer portion 3c is then formed in the second "min. 2" region. This enables layer 3 including oxidation grading between layer portions 3a–3c to be formed using only a single sputtering cathode/target T, which can significantly reduce hardware costs and potentially frees cathode positions for other layer(s) in that or other coating(s).

Conventionally, when it is desired to use a NiCr target to form a NiCrO$_x$ layer, the amount of oxygen (O$_2$) gas used during the sputtering of the layer from that target is e.g., about 12 sccm/kW, to that the entire layer is oxided. However, it has been found that using a much lower oxygen gas flow during sputtering enables achievement of the aforesaid oxidation grading of layer 3 (i.e., so that it is much more metallic in the central portion 3a thereof than at the oxided top/bottom portions 3c/3b thereof). In particular, in certain embodiments of this invention the oxygen (O$_2$) gas flow at the cathode/target T for forming oxidation graded layer 3 is from about 0.1 to 4.0 sccm per kW of power used (sccm/kW), more preferably from about 0.5 to 2.5 sccm/kW, even more preferably from about 0.5 to 1.5 sccm/kW, and a particular example being about 1.0 sccm/kW. As will be shown below, other gas(es) (e.g., an inert gas such as Ar) is also used in combination with the oxygen at the cathode/target T for layer 3; in certain example embodiments of this invention the ratio of argon gas to oxygen gas (argon:oxygen) at the cathode/target T is from 2:1 to 20:1, more preferably from 3:1 to 10:1. Amounts of oxygen gas used at the cathode/target T according to certain embodiments of this invention are not enough to cause significant oxidation in central layer portion 3a of layer 3; however, due to the effective slow deposition rates in the "min." areas as the substrate approaches and leaves the cathode/target T, the upper/top and lower/bottom layer portions 3c and 3b of layer 3 are significantly oxidized and can serve as anti-migration or barrier layers between the dielectrics (e.g., silicon nitride) and the more metallic central layer portion 3a.

The amount of oxygen gas used determines the thickness (es) of oxide layer portions 3b and 3c relative to more metallic layer portion 3a (i.e., the more oxygen gas used, the thicker oxide portions 3b, 3c get and the thinner central metallic portion 3a becomes assuming a common line speed). Moreover, the thickness and oxidation amount(s) of anti-migration layer portions 3b and 3c can be adjusted and/or influenced by chamber design, gas distribution, cathode power (kW), argon gas flow, oxygen gas flow, line speed, and/or the like. It is noted that other gases (e.g., nitrogen) may be used in combination with the oxygen and argon in certain embodiments of this invention. It is noted that the term "oxygen" when used to describe a gas herein includes pure O$_2$ gas as well as other oxygen inclusive gases such as CO$_2$, NO, SO$_2$, or the like which may also be used to introduce oxygen gas at the cathode/target T in order to form oxide layer portions 3b, 3c.

Figure 3:
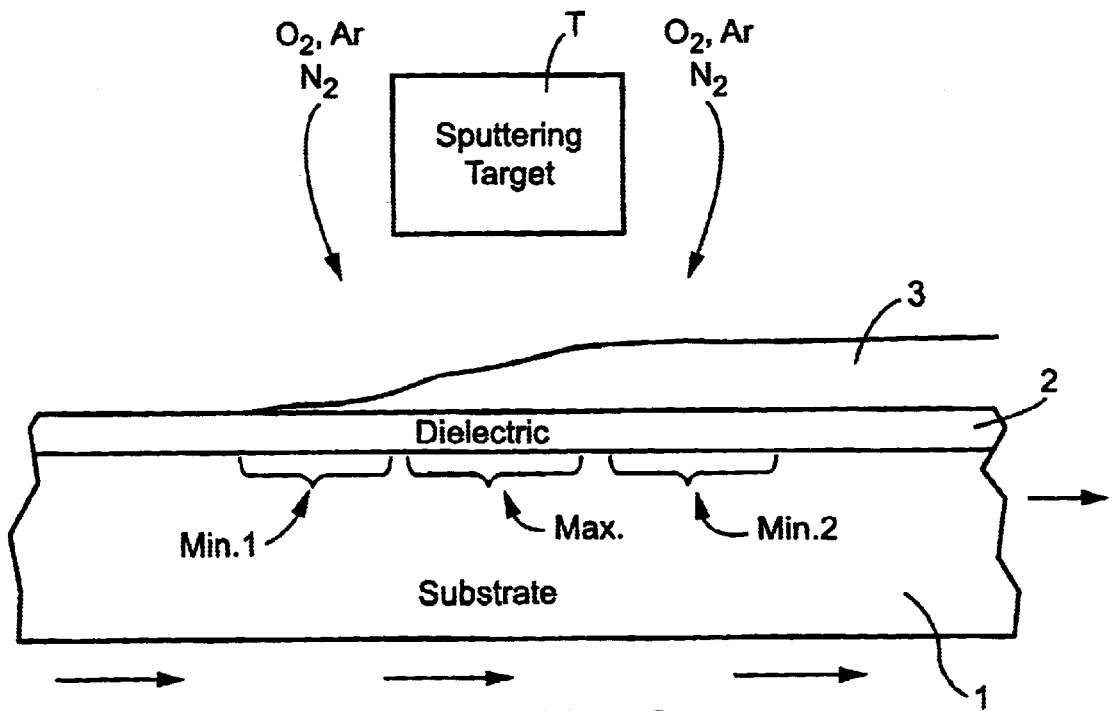
FIG. 3 is a schematic diagram illustrating another example way in which a layer structure according to an embodiment of this invention can be deposited.
Figure 4:
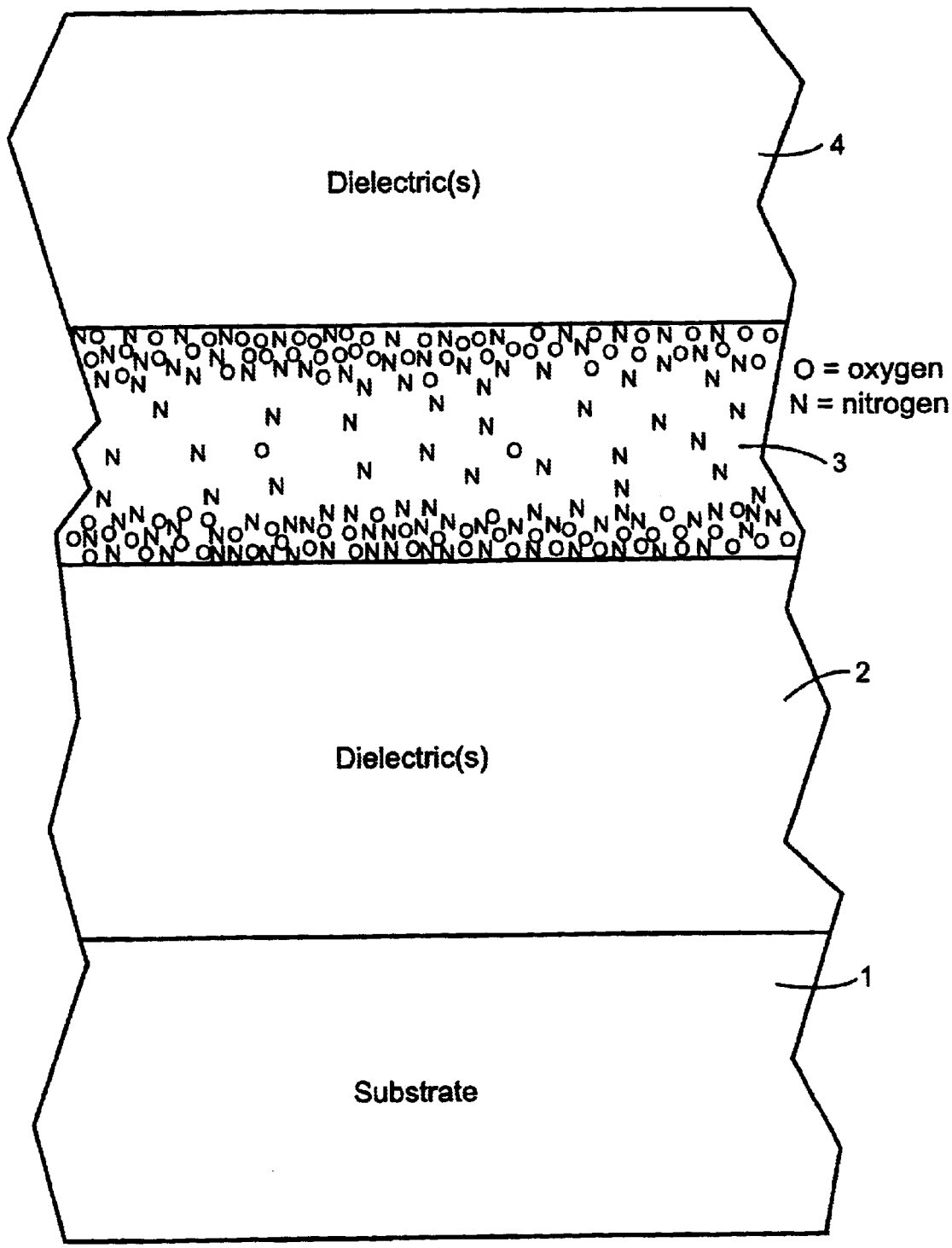
FIG. 4 is a partial side cross sectional view of a coated article sputtered using the technique of FIG. 3.

Reference is now made to FIGS. 3–4. While FIG. 2 illustrates the use of oxygen and argon gas at the cathode/target T to form the layer 3 of FIG. 1, FIG. 3 illustrates that nitrogen gas may be used at the cathode/target T in addition to the argon and oxygen gas. When nitrogen gas is added as in FIG. 3, the result in certain example embodiments is the layer 3 as illustrated in FIG. 4 which is still oxidation graded. In particular, the addition of nitrogen gas may for example cause layer portions 3b and 3c to be oxynitride layer portions (e.g., NiCrO$_x$N$_y$) and the central layer portion 3a to be at least partially nitrided (e.g., NiCrN$_x$). However, central layer portion 3a is still less oxidized (and more metallic) than oxynitride layer portions 3b, 3c. The amount of nitrogen gas added determines the extent to which central layer portion 3a is nitrided.

Examples

Examples 1–2 were made according to different embodiments of this invention (i.e., they included oxygen and argon gas flow at the cathode/target T for formation of layer 3). In particular, Example 1 was as illustrated in FIGS. 1–2 where the dielectric layers 2 and 4 were silicon nitride, and a NiCr inclusive sputtering target T was used so that layer portion 3a was mostly NiCr, and oxide layer portions 3b and 3c were of or included $NiCrO_x$. Example 2 was as illustrated in FIGS. 3–4 (nitrogen gas was also used at the cathode/target T in combination with oxygen and argon) where the dielectric layers 2 and 4 were silicon nitride, and a NiCr inclusive sputtering target T was used so that layer portion 3a was mostly $NiCrN_x$, and oxynitride layer portions 3b and 3c were of or included $NiCrO_xN_y$. In both Examples 1 and 2, layer portions 3b and 3c were much more oxidized than layer portion 3a, so that layer 3 was oxidation graded.

In both Examples, the layer system(s) was sputtered onto a 6.0 mm thick clear soda-lime-silica glass substrate 1. A Leybold Terra-G six-chamber sputter coating apparatus was used. Five cathodes were in each chamber, so there were a total of 30 cathode targets in the sputter coater (not all were used). Cathode numbering utilizes the first digit to refer to the coater chamber, and the second digit to refer to the cathode position in that chamber. For example, cathode #42 was the second cathode (second digit) in the fourth (first digit) sputter chamber. Cathode #s 42, 61 and 64 were dual C-Mag type cathodes; and cathode #45 was a planar cathode. The Si targets included Al content of approximately 10%. The line speed was 0.75 m/min (meters per minute) for cathode/target 42, and 2.51 m/min for cathode #s 45, 61 and 64. All gas flows (e.g., argon, oxygen and nitrogen) are presented in units of sccm. Voltage is measured in terms of volts, and frequency in terms of kHz. Pressure is measured in hPa, and power to the cathode(s) in kW. T-gas refers to tuning gas used to individually adjust gas flows along cathode length. For cathode #42 in each example below, the tuning gas was distributed 45% pump side, 5% center and 50% view side. For cathode #45, the tuning gas was distributed 15% pump side, 70% center, and 15% view side. The tuning gas for cathode #s 61 and 64 was distributed 50% pump side and 50% view side. The NiCr targets were approximately 80/20 NiCr.

Those skilled in the art will appreciate that in Examples 1–2 cathode #42 was used to form dielectric layer 2 of silicon nitride, cathode #45 was used to form oxidation graded layer 3, and cathode #s 61 and 64 were used to form dielectric layer 4 of silicon nitride. As can be seen from the above, the small amounts of oxygen ($O_2$) gas per kW of power used in Examples 1–2 for cathode #45 enable layer 3 to include both mostly metallic central layer portion 3a, and oxided layer portions 3b and 3c which were much more oxidized than portion 3a. In Example 1, the oxygen flow for cathode #45 (and thus layer 3) was about 1.01 sccm/kW (i.e., 29.5 sccm oxygen flow divided by 29.12 kW of power used equals 1.01 sccm/kW). In Example 2, the oxygen flow for cathode #45 (and thus layer 3) was also about 1.01 sccm/kW (i.e., 31 sccm oxygen flow divided by 30.63 kW of power used equals 1.01 sccm/kW). These low amounts of oxygen gas flow in combination with the high corresponding amounts of argon gas flow during formation of layer 3 resulted in the oxidation grading of layers 3, and were found to work well. It will be shown below that Examples 1–2 according to this invention were much more color stable upon HT than the Comparative Example discussed above.

After being sputtered onto glass substrate 1 as set forth above, the resulting coated articles of Examples 1–2 were tested and found to have the following characteristics monolithically (not in an IG unit), where the heat treatment (HT) involved heating the monolithic product at about 625 degrees C. for about 10 minutes. It is noted that a* and b* color coordinate values (and transmission values) are in accordance with CIE LAB 1976, Ill. C 2 degree observer technique, and Δa* and Δb* are in terms of absolute value. Moreover, sheet resistance ($R_s$) is in units of ohms per square as is known in the art.

| Value/Measurement | (Pre-HT) | (Post-HT) |
|---|---|---|
| Example 1 (measurements before/after HT) | | |
| Transmission (TY) %: | 13.97 | 13.73 |
| $L*_T$: | 44.19 | 43.84 |
| $a*_T$: | −0.74 | −0.5 |
| $b*_T$: | −2.99 | −4.14 |
| $\Delta a*_T$ (transmissive): | | 0.24 |
| $\Delta b*_T$ (transmissive): | | 1.15 |
| $\Delta E*_T$ (transmissive): | | 1.23 |

| Cathode | Target | Power | Voltage | Pressure | Ar | $N_2$ | $O_2$ | Freq. | T-Gas |
|---|---|---|---|---|---|---|---|---|---|
| COATER SET-UP: EXAMPLE 1 | | | | | | | | | |
| #42 | Si | 68.74 kW | 352 | 4.02E−03 | 201 | 478 | 0.6 | 29 | $N_2$ (100 sccm) |
| #45 | Ni/Cr | 29.12 kW | 531 | 2.37E−03 | 120 | 0 | 29.5 | n/a | Ar (100 sccm) |
| #61 | Si | 29.89 kW | 255 | 3.79E−03 | 203 | 182 | 1 | 26 | $N_2$ (100 sccm) |
| #64 | Si | 30.06 kW | 231 | 2.75E−03 | 201 | 181 | 7 | 26 | $N_2$ (100 sccm) |
| COATER SET-UP: EXAMPLE 2 | | | | | | | | | |
| #42 | Si | 68.77 kW | 352 | 4.09E−03 | 201 | 478 | 0.4 | 29 | $N_2$ (100 sccm) |
| #45 | Ni/Cr | 30.63 kW | 561 | 2.76E−03 | 120 | 184 | 31 | n/a | Ar (100 sccm) |
| #61 | Si | 29.86 kW | 255 | 3.81E−03 | 203 | 181 | 1 | 26 | $N_2$ (100 sccm) |
| #64 | Si | 29.95 kW | 231 | 2.75E−03 | 201 | 181 | 7 | 26 | $N_2$ (100 sccm) |

-continued

| Value/Measurement | (Pre-HT) | (Post-HT) |
|---|---|---|
| Glass side | | |
| Reflectance ($R_G Y$ %): | 30.43 | 31.43 |
| $L^*_G$: | 62.02 | 62.87 |
| $a^*_G$: | −3.01 | −2.74 |
| $b^*_G$: | −10.81 | −10.66 |
| $\Delta a^*_G$ (glass side): | | 0.27 |
| $\Delta b^*_G$ (glass side): | | 0.15 |
| $\Delta E^*_G$ (glass side): | | 0.90 |
| Film side | | |
| Reflectance ($R_F Y$ %): | 35.76 | 38.19 |
| $L^*_F$: | 66.34 | 68.16 |
| $a^*_F$: | 0.1 | −0.42 |
| $b^*_F$: | 26.81 | 25.2 |
| $\Delta a^*_F$ (film side): | | 0.43 |
| $\Delta b^*_F$ (film side): | | 1.61 |
| $\Delta E^*_F$ (film side): | | 2.48 |
| $R_s$ (ohms/sq.): | 45.0 | 45.3 |
| Example 2 (measurements before/after HT) | | |
| Transmission (TY) %: | 23.62 | 25.13 |
| $L^*_T$: | 55.7 | 57.2 |
| $a^*_T$: | −1.69 | −1.89 |
| $b^*_T$: | −0.13 | −1.35 |
| $\Delta a^*_T$ (transmissive): | | 0.20 |
| $\Delta b^*_T$ (transmissive): | | 1.22 |
| $\Delta E^*_T$ (transmissive): | | 1.94 |
| Glass side | | |
| Reflectance ($R_G Y$ %): | 19.25 | 18.3 |
| $L^*_G$: | 50.98 | 49.86 |
| $a^*_G$: | −1.16 | −0.27 |
| $b^*_G$: | −17.53 | −17.66 |
| $\Delta a^*_G$ (glass side): | | 0.89 |
| $\Delta b^*_G$ (glass side): | | 0.13 |
| $\Delta E^*_G$ (glass side): | | 1.44 |
| Film side | | |
| Reflectance ($R_F Y$ %): | 27.1 | 27.14 |
| $L^*_F$: | 59.07 | 59.1 |
| $a^*_F$: | 1.24 | 1.13 |
| $b^*_F$: | 28.39 | 28.46 |
| $\Delta a^*_F$ (film side): | | 0.11 |
| $\Delta b^*_F$ (film side): | | 0.07 |
| $\Delta E^*_F$ (film side): | | 0.13 |
| $R_s$ (ohms/sq.): | 66.7 | 15.1 |

As can be seen above, Examples 1–2 were characterized by excellent color stability with HT (i.e., low $\Delta E^*$ values, $\Delta a^*$ values, and/or $\Delta b^*$ values). It is believed that these good features result from the presence of oxidation graded layer 3 that includes anti-migration oxide layer portions 3b and 3c surrounding more metallic solar control and IR reflecting layer portion 3a. In the table below, it will be illustrated how Examples 1–2 of the instant invention have much better (i.e., lower) $\Delta E^*$ values than the Comparative Example discussed above.

| COLOR STABILITY UPON HEAT TREATMENT | | | |
|---|---|---|---|
| | $\Delta E^*$ (glass side) | $\Delta E^*$ (trans.) | $\Delta E^*$ (film side) |
| Example 1: | 0.90 | 1.23 | 2.48 |
| Example 2: | 1.44 | 1.94 | 0.13 |
| Comparative Example: | n/a | 5.9 | 6.86 |

Clearly, it can be seen that Examples 1–2 of this invention had much better color stability upon heat treatment (HT) than did the Comparative Example.

FIGS. 5 and 6 are XPS plots illustrating the chemical elemental make-up of the Example 1 coating before and after HT, respectively. It can be seen that any Ni or N migration upon HT was minimal. For purposes of clarification, the left-hand portion of FIG. 5 shows the upper silicon nitride layer 4, the apex where the Ni juts/extends upwardly is indicative of NiCr mostly metal layer portion 3a, and the plateau extending across the central portion of the graph is indicative of the bottom silicon nitride layer. The far right portion of the plot shows the glass substrate 1. The anti-migration oxide layer portions 3b and 3c are shown in the graph immediately on each side of the Ni apex where the oxygen content spikes. It can be seen that layer portions 3b and 3c are relatively thin compared to more metallic layer portion 3a. In a similar manner, FIGS. 7–8 illustrate the elemental make-up of Example 2 before and after HT, respectively. It can be seen that Ni and N migration upon HT has been kept very small in this invention.

It is also noted that in certain embodiments of this invention, coated articles have a sheet resistance ($R_s$) of no greater than 500 ohms/sq. after HT, more preferably no greater than 250 ohms/sq. after HT, even more preferably no greater than about 100 ohms/sq. before and/or after HT, and in some embodiments no greater than about 70 ohms/sq. before and/or after HT. However, it is noted that in some embodiments sheet resistance is a function of NiCr layer thickness, which can vary in different embodiments; thus sheet resistance also varies depending upon the desired application and need not be confined within the aforesaid limits in all embodiments of this invention. Moreover, in certain example embodiments of this invention, coated articles herein experience a reduction in sheet resistance upon HT (in contrast to the Comparative Example above). Coated articles herein in certain example embodiments also have a hemispherical emissivity ($E_h$) of no greater than about 1.0, more preferably no greater than about 0.5, and most preferably no greater than about 0.4 before and/or after HT. Additionally, monolithic coated articles according to certain embodiments of this invention preferably have a visible transmittance (TY %) of from 5–80% (more preferably from 7–30%) before and/or after HT. Additionally, monolithic coated articles according to certain embodiments of this invention preferably have a glass side reflectance value ($R_G Y$ %) of at least 15%, and more preferably from 18–42% before and/or after HT. The aforesaid characteristics may be measured at a clear float glass nominal substrate thickness of about 6 mm, or any other suitable substrate thickness from 1–12 mm. Moreover, it is noted that coated articles herein may ultimately be utilized in the context of an IG unit, a vehicle window, an architectural window, or the like.

Once given the above disclosure many other features, modifications and improvements will become apparent to the skilled artisan. Such other features, modifications and improvements are therefore considered to be a part of this invention, the scope of which is to be determined by the following claims:

What is claimed is:

1. A heat treated coated article comprising:

first and second dielectric layers supported by a substrate, wherein each of said first and second dielectric layers comprise silicon nitride;

a layer structure provided between the first and second dielectric layers, said layer structure including an at least partially oxidized top layer portion, a central layer portion and an at least partially oxidized bottom layer portion, wherein the central layer portion is more metallic than the top and bottom layer portions; and wherein the coated article has a transmissive $\Delta E^*$ value no greater than 5.0 upon heat treatment.

2. The coated article of claim 1, wherein said coated article has a transmissive $\Delta E^*$ value no greater than 3.0 upon heat treatment.

3. The coated article of claim 2, wherein said coated article has a transmissive $\Delta E^*$ value no greater than 2.0 upon heat treatment.

4. The coated article of claim 1, wherein said coated article has a glass side $\Delta E^*$ value no greater than 5.0 upon heat treatment.

5. The coated article of claim 4, wherein said coated article has a glass side $\Delta E^*$ value no greater than 3.5 upon heat treatment.

6. The coated article of claim 5, wherein said coated article has a glass side $\Delta E^*$ value no greater than 2.0 upon heat treatment.

7. The coated article of claim 1, wherein the central layer portion comprises NiCr and the top and bottom layer portions each comprise an oxide of NiCr.

8. The coated article of claim 1, wherein the central layer portion comprises NiCr and the top and bottom layer portions each comprise an oxynitride of NiCr.

9. The coated article of claim 8, wherein the central layer portion comprises a nitride of NiCr.

10. The coated article of claim 1, wherein the central layer portion is no more than about 30% oxidized, and wherein the top and bottom layer portions are each at least 50% oxidized.

11. The coated article of claim 10, wherein the top and bottom layer portions are each at least 70% oxidized.

12. The coated article of claim 11, wherein the central layer portion is no more than about 5% oxidized, and the top and bottom layer portions are each at least 80% oxidized.

13. The coated article of claim 12, wherein the central layer portion is from about 20–300 Å thick, and the top and bottom layer portions are each thinner than the central layer portion and are each from about 5–50 Å thick.

14. The coated article of claim 1, wherein the central layer portion is from 0–5% oxidized.

15. The coated article of claim 1, wherein at least one of the at least partially oxidized layer portions contacts one of the dielectric layers.

16. The coated article of claim 1, wherein the coated article has a $\Delta a^*$ value (glass side) of no greater than 1.5 upon heat treatment.

17. The coated article of claim 1, wherein the top and bottom layer portions each comprise an oxynitride.

18. A heat treated coated article comprising:
first and second dielectric layers each comprising silicon nitride supported by a substrate;
a layer comprising at least first and second metal oxide portions located between the first and second dielectric layers, wherein the first and second metal oxide portions are separated from one another by a central layer portion that is less oxidized than either of the first and second metal oxide portions; and
wherein the coated article has a $\Delta E^*$ value no greater than 5.0 after heat treatment.

19. The coated article of claim 18, wherein the $\Delta E^*$ value is one of glass side reflective and transmissive.

20. The coated article of claim 18, wherein the first and second metal oxide portions each comprise an oxide of NiCr, and the central layer portion comprises NiCr.

21. The coated article of claim 18, wherein the central layer portion is no more than about 30% oxidized, and wherein the first and second metal oxide portions are each at least 50% oxidized.

22. The coated article of claim 21, wherein the metal oxide portions are each at least 70% oxidized.

23. The coated article of claim 22, wherein the central layer portion is from 0–5% oxidized, and the metal oxide portions are each from 80–100% oxidized.

24. The coated article of claim 18, wherein the coated article has a $\Delta E^*$ (glass side) value no greater than 3.5 after heat treatment.

25. The coated article of claim 18, wherein the coated article has a $\Delta E^*$ (glass side reflective) value no greater than 2.0 after heat treatment.

26. A heat treated coated article comprising:
first and second dielectric layers supported by a substrate, each of said first and second dielectric layers comprising silicon nitride;
a layer comprising at least first and second metal oxynitride portions located between the first and second dielectric layers, wherein the first and second metal oxynitride portions are separated from one another by a central layer portion that is less oxidized than either of the first and second metal oxynitride portions; and
wherein the coated article has a $\Delta E^*$ value no greater than 5.0 after heat treatment.

27. The coated article of claim 26, wherein the $\Delta E^*$ value is one of glass side reflective and transmissive.

28. The coated article of claim 26, wherein the first and second metal oxynitride portions each comprise an oxynitride of NiCr and the central layer portion comprises a nitride of NiCr.

29. The coated article of claim 26, wherein the central layer portion is no more than about 30% oxidized, and wherein the first and second metal oxynitride portions are each at least 50% oxidized.

30. The coated article of claim 29, wherein the metal oxynitride portions are each from 70–100% oxidized.

31. The coated article of claim 26, wherein the central layer portion is from about 0–5% oxidized.

32. The coated article of claim 26, wherein the coated article has a $\Delta E^*$ (glass side reflective) value no greater than 3.5 after heat treatment.

33. The coated article of claim 26, wherein the coated article has a $\Delta E^*$ (glass side reflective) value no greater than 2.0 after heat treatment.

34. The coated article of claim 26, wherein each of the metal oxynitride portions contacts a respective one of the dielectric layers.

35. A heat treated coated article comprising:
first and second dielectric layers each comprising silicon nitride;
a layer structure supported by a substrate and located between the first and second dielectric layers, the layer structure being made using a single sputtering target so as to oxidation graded to include first and second oxide portions which are each at least partially oxidized and which sandwich therebetween a central portion that is more metallic than the first and second oxide portions,
wherein the first and second oxide portions are each from 50–100% oxidized and the central portion is from 0–10% oxidized; and
wherein the coated article has a $\Delta E^*$ value no greater than 5.0 after heat treatment.

36. The coated article of claim 35, wherein the first and second oxide portions are from 70–100% oxidized and the central portion is from 0–5% oxidized.

37. A coated article comprising:
a layer supported by a substrate and being located between at least first and second layers comprising silicon nitride, the layer being made using a single metal inclusive sputtering target so as to be oxidation graded to include first and second metal oxynitride portions which are each at least partially oxidized and which sandwich therebetween a central portion that is more metallic than the first and second oxynitride portions, wherein the central portion is from about 0–10% oxidized, and wherein the coated article has a ΔE* value no greater than 5.0 after heat treatment.

38. The coated article of claim 37, wherein the first and second oxynitride portions are from about 50–100% oxidized and the central portion is from about 0–5% oxidized.

39. A heat treated coated article comprising:

first and second dielectric layers each comprising a nitride supported by a substrate;

a layer structure provided between the first and second dielectric layers, the layer structure including first and second metal oxide inclusive layer portions and a metal layer portion located between the first and second metal oxide inclusive layer portions;

wherein the metal oxide inclusive layer portions each comprise oxides of the same metal as in the metal layer portion; and wherein the coated article has a ΔE* value no greater than 5.0 after heat treatment.

40. The coated article of claim 39, wherein the ΔE* value is at least one of transmissive and glass side reflective.

41. The coated article of claim 39, wherein the first and second metal oxide inclusive layer portions each comprise an oxide of NiCr and the metal layer portion comprises NiCr.

42. The coated article of claim 39, wherein said coated article has a transmissive ΔE* value no greater than 3.0 after heat treatment.

43. The coated article of claim 39, wherein said coated article has a transmissive ΔE* value no greater than 2.0 after heat treatment.

44. A heat treated coated article comprising:

first and second dielectric layers each comprising silicon nitride and being supported by a substrate;

an oxidation graded layer located between the first and second dielectric layers, the oxidation graded layer having a top side and a bottom side;

wherein the oxidation graded layer is oxidation graded to become gradually less oxidized from the bottom side of the layer to a central portion of the layer and then to become gradually more oxidized from the central portion of the layer to the top side of the layer; and wherein the coated article has a ΔE* value no greater than 5.0 after heat treatment.

45. The coated article of claim 44, wherein top and bottom layer portions of the oxidation graded layer which are located immediately adjacent the top and bottom sides of the oxidation graded layer, respectively, each comprises an oxide of at least one of Ni and Cr.

46. The coated article of claim 45, wherein the central portion of the oxidation graded layer is significantly more metallic than the top and bottom layar portions and comprises at least one of Ni and Cr.

47. The coated article of claim 44, wherein the oxidation graded layer is at least partially nitrided.

48. The coated article of claim 44, wherein the coated article has a ΔE* value (glass side reflective) of less than or equal to 3.5 upon heut treatment.

49. The coated article of claim 44, wherein the coated article has a ΔE* value (glass side reflective) of less than or equal to 2.0 upon heat treatment.

50. The coated article of claim 18, wherein said layer comprising said at least first and second metal oxide portions is located between and contacting each of said first and second dielectric layers.

51. The coated article of claim 26, wherein said layer comprising said at least first and second metal oxynitride portions is located between and contacting each of said first and second dielectric layers.

52. The coated article of claim 35, wherein said layer structure comprising said first and second oxide portions being located between and contacting each of said first and second dielectric layers.

53. The coated article of claim 37, and wherein said layer comprising said first and second oxynitride portions being located between and contacting each of said first and second dielectric layers.

* * * * *